United States Patent
Trivette et al.

(10) Patent No.: US 7,275,001 B2
(45) Date of Patent: Sep. 25, 2007

(54) METHOD FOR MEASURING ELECTRICAL CURRENT LEVELS IN A POWER SWITCHING DEVICE

(75) Inventors: Marty L. Trivette, Cary, NC (US); Erskine R. Barbour, Benson, NC (US); David C. Whyte, Fayetteville, NC (US); Carl J. LaPlace, Jr., Raleigh, NC (US)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 11/125,969

(22) Filed: May 10, 2005

(65) Prior Publication Data

US 2006/0265157 A1     Nov. 23, 2006

(51) Int. Cl.
*G06F 3/01* (2006.01)
(52) U.S. Cl. .......................... 702/64; 702/65; 702/188; 702/189

(58) Field of Classification Search .................. 702/64, 702/65, 188, 189; 361/103
See application file for complete search history.

(56) References Cited

U.S. PATENT DOCUMENTS

| | | | | |
|---|---|---|---|---|
| 4,445,183 A | * | 4/1984 | McCollum et al. | 700/294 |
| 5,495,155 A | * | 2/1996 | Juzswik et al. | 318/293 |
| 6,061,221 A | * | 5/2000 | Tihanyi | 361/103 |
| 6,765,776 B2 | * | 7/2004 | Kelwaski | 361/93.9 |
| 2003/0095366 A1 | * | 5/2003 | Pellegrino | 361/93.1 |

* cited by examiner

*Primary Examiner*—Eliseo Ramos-Feliciano
*Assistant Examiner*—Felix Suarez
(74) *Attorney, Agent, or Firm*—Paul R. Katterle

(57) ABSTRACT

A method for determining an electrical current value using at least two current sensing circuits. One current sensing circuit is provided if the current value is below a switching threshold. The other current sensing is provided if the current value is above a switching threshold. Both current sensing circuits having a processing means to process the current signal and a determining means to determine the value of the current signal.

10 Claims, 5 Drawing Sheets

METHOD FOR MEASURING ELECTRICAL CURRENT LEVELS IN A POWER SWITCHING DEVICE

FIELD OF THE INVENTION

The present invention relates to a power switching device and more particularly to a controller used to detect electrical current levels in a power switching device.

BACKGROUND OF THE INVENTION

In the power generation and distribution industry, utility companies generate electricity and distribute the electricity to customers. To facilitate the process of distributing electricity, various types of power switching devices are used. In a distribution circuit, electricity flows through the power switching devices from a power generation source (typically a substation or the like) to the consumer. When a fault is detected in the distribution circuit, the power switching device is opened and the electrical connection is broken.

Controllers are used by the utility company to detect faults that occur in the distribution circuit. This type of controller typically uses a microprocessor programmed to respond to the fault based on the type of fault and the type of power switching device connected to the controller. The controller may respond to a particular fault by causing the power switching device to remain open. Alternatively, upon the detection of a fault, the controller may cause the power switching device to open and close multiple times.

In order to determine if a fault is present in the distribution circuit, the controller monitors the amount of electrical current flowing through the power switching device. If the amount of current exceeds a preprogrammed threshold for a certain period of time, the controller instructs the power switching device to perform the preprogrammed response.

Within the power switching device, a current transformer is generally used to monitor the current levels. The analog signal from the current transformer is sent to the controller and the controller processes the analog signal. In previous controller designs, an "auto-ranging" current detection scheme is implemented. In order to auto-range, the controller contains hardware and software that allows it to be able to determine the range of current being conducted. Once the range is determined, a specific value is then established by the controller. This type of auto-ranging circuit generally uses a single current measurement circuit.

One drawback to the auto-ranging controller is that the accuracy of current measurement diminishes as the current values get smaller. The controller needs to accurately measure current levels in the range of 20 amperes up to 24,000 amperes. The present invention provides an accurate measurement of current flowing through a power switching device and improves the accuracy of the current measurement at a cost lower than the current measurement of the auto-ranging scheme.

SUMMARY OF THE INVENTION

A method for measuring electrical current flowing through a power switching device, the power switching device sending a proportional electrical current to a first current sensing circuit and to a second current sensing circuit, the method comprising:

processing the proportional electrical current and producing a first output signal through said first current sensing circuit and a second output signal through said second current sensing circuit; and determining a value for the electrical current flowing through the power switching device based on said first output signal if said first output signal does not exceed a preprogrammed switching threshold or on said second output signal if said first output signal exceeds said preprogrammed switching threshold.

A controller for use in measuring current flowing through a power switching device, the controller comprising:

a first current sensing circuit, said first current sensing circuit receiving a proportional electrical current from the power switching device; and producing a first output signal;

a second current sensing circuit, said second current sensing circuit receiving the proportional electrical current from the power switching device; and producing a second output signal; and processing means for determining a value for the electrical current flowing through the power switching device, wherein said current value is determined based on said first output signal if said first output signal does not exceed a preprogrammed switching threshold or on said second output signal if said first output signal exceeds said preprogrammed switching threshold.

BRIEF DESCRIPTION OF THE DRAWINGS

The invention is further described in the detailed description that follows, by reference to the noted drawings by way of non-limiting illustrative embodiments of the invention, in which like reference numerals represent similar elements throughout the several views of the drawings, and wherein.

DETAILED DESCRIPTION OF ILLUSTRATIVE EMBODIMENTS

Figure 1:
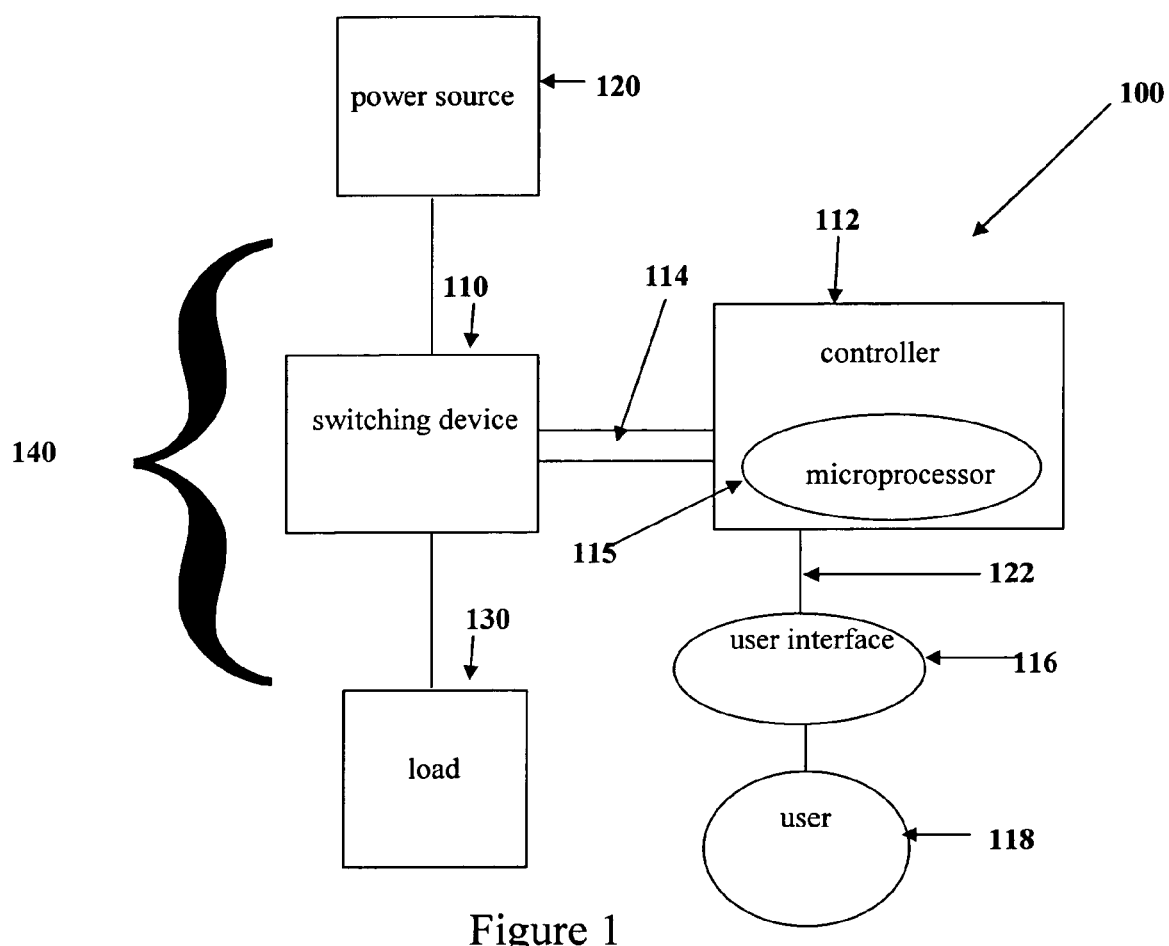
FIG. 1 illustrates a block diagram of a typical power switching configuration.

FIG. 1 shows a block diagram of a typical power switching configuration 100. The power switching configuration 100 has a power switching device 110 which is connected in series between a power source 120 and a load 130. The electrical circuit between the power source 120 and the load 130 is referred to as the power distribution circuit 140. The power switching device 110 is connected to a controller 112 by a bidirectional communications bus 114. A microprocessor 115 provides the controller 112 with the processing capability to monitor the power switching device 110 for faults. A user 118 configures the controller 112 and receives information from the controller 112 via a user interface 116. The user interface 116 connects to the controller 112 through a communication means 122. The distribution circuit 140 is shown as a single phase of a three phase circuit for ease of illustration. The other two phases are identical.

The power switching device 110 connects the power source 120 to the load 130. A power source 120 used with the present invention is a substation that provides, for example, a 15 kV-38 kV source of three phase AC power. An individual transformer or bank of transformers connected together comprises the load 130. The transformers may be three phase transformers for large industrial applications or single phase transformers used to provide electricity to a residential consumer.

Three types of power switching devices 110 that utility companies use in the power switching configuration 100 are fault interrupters, breakers and reclosers. Each power switching device 110 performs a preprogrammed response when a fault condition in the power distribution circuit 140 is detected by the controller 112. For example, the fault interrupter opens once and remains open when a fault condition is detected. The breaker opens after a fault, but attempts to close before remaining open if the fault continues to exist. A recloser opens and closes multiple times when a fault condition exists. By opening and closing multiple times, the recloser attempts to clear the fault. Should the fault condition continue to exist, the recloser opens and remains open until reset manually. The recloser enters a "lock out" state when this occurs.

A fault condition occurs when one phase of power becomes shorted to ground, phases become shorted to each other, or when lightning strikes the distribution circuit 140. When a fault condition occurs, large amounts of current flow through the power distribution circuit 140. The controller 112 monitors the voltage and current levels communicated to it by the power switching device 110. The power switching device 110 sends this information to the controller 112 through the bidirectional communications bus 114. When an abnormal current level is detected by the controller 112, the controller 112 signals the power switching device 110 to execute the preprogrammed response. Two example controllers 112 used with the present invention are the ICD (Intelligent Control Device) and the PCD (Programmable Control Device), manufactured by ABB Inc.

A user 118 may be the utility craftsperson who is at the power switching device location. The craftsperson can use a laptop PC as the user interface 116 and connect directly to a serial port on the controller 112. The connection to the serial port is the communication means 122. Another user 118 may be the utility maintenance person remotely logged into the controller 112. In this example, the remotely located utility maintenance person uses a desktop PC for the user interface 116 and a modem configuration as the communication means 122 to connect to the controller 112.

Figure 2:
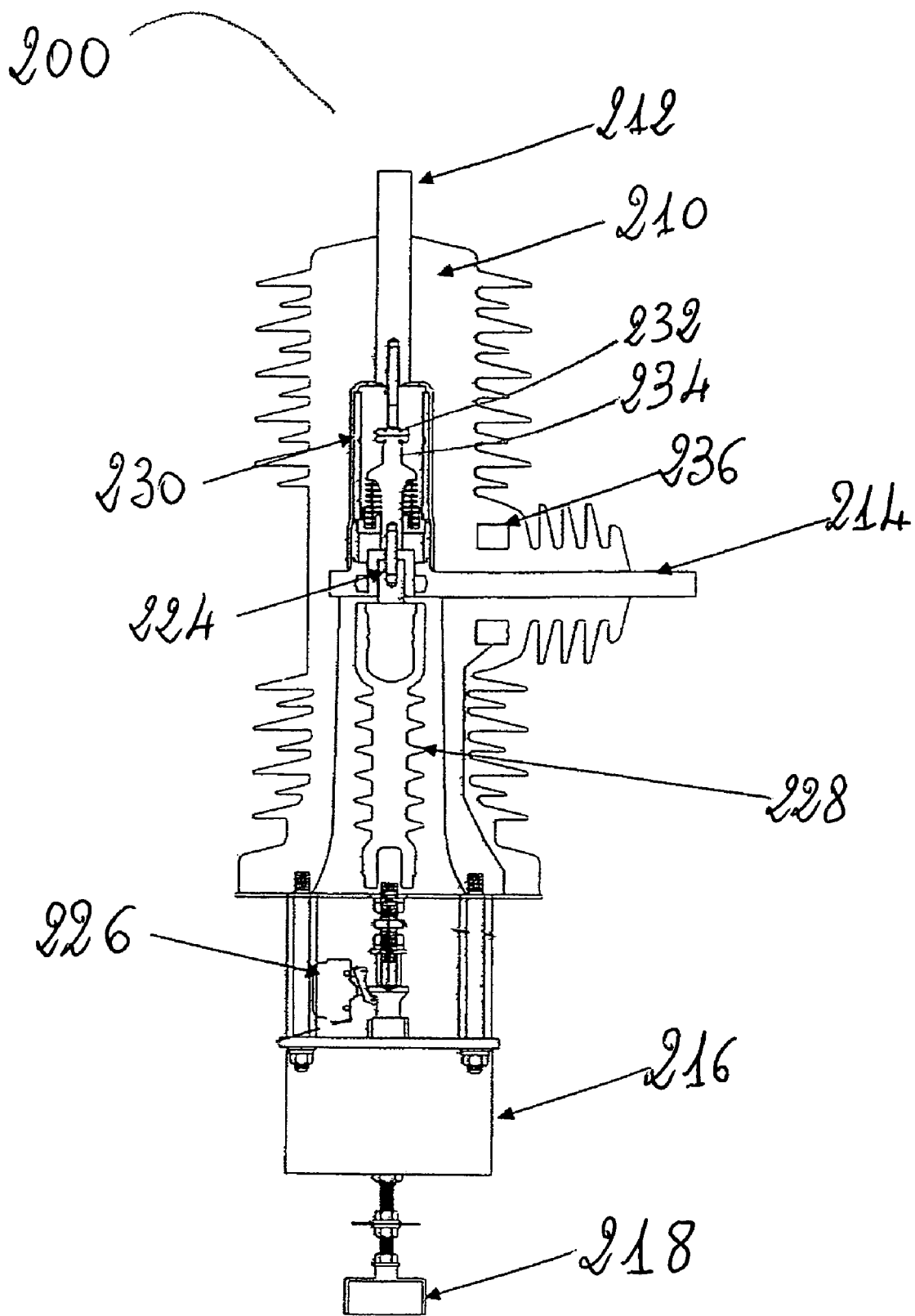
FIG. 2 illustrates a cross sectional view of a recloser used in the power generation and distribution industry.

A cross sectional view of a typical power switching device 110 in the form of a recloser 200 such as the OVR 1 Single Phase Recloser manufactured as of the filing of the present U.S. patent application by ABB Inc. is illustrated in FIG. 2. Current flows through the recloser 200 from an H1 connector 212, through a vacuum interrupter 230 and a current transfer assembly 224 to an H2 connector 214. The vacuum interrupter 230 provides an enclosure that houses a stationary contact 232 and a moveable contact 234. The stationary contact 232 is directly connected to the H1 connector 212. The current transfer assembly 224 provides the electrical connection between the moveable contact 234 and the H2 connector 214.

Mounted around the H2 connector 214 is a power switching current transformer 236. As the AC current flows through the recloser 200, it causes a proportional electrical current to flow through the power switching current transformer 236. In one embodiment, the ratio of current flowing through the recloser 200 to the proportional current flowing through the power switching current transformer 236 is 600:1. The proportional current from the power switching current transformer 236 is sent to the controller 112 through the bidirectional communications bus 114.

Figure 3A:
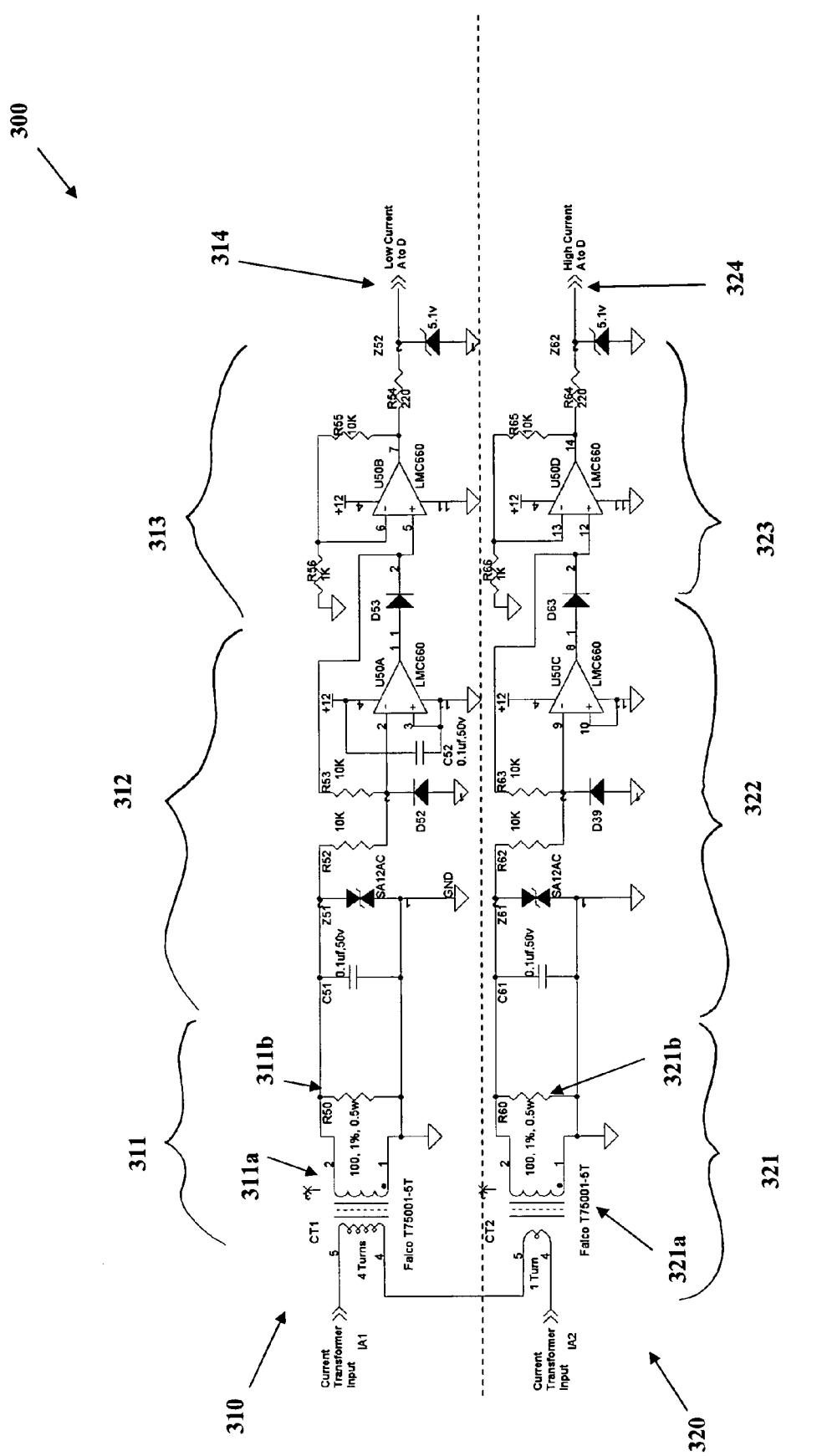
FIG. 3A illustrates a schematic diagram of a current sensing circuit for a controller in accordance with one embodiment of the present invention.

Within the controller 112, the proportional current from the power switching current transformer 236 is processed by the microprocessor 115 through a current sensing circuit 300, an example of which is shown in the schematic drawing of FIG. 3A. In this embodiment, a Motorola HC12D60 microprocessor is used. The current sensing circuit 300 has a low current section 310 and a high current section 320. The circuitry for both sections 310 and 320 is identical except for the respective current transformers 311a, and 321a. Each current section 310, 320 has a current transformer circuit 311, 321, a rectifying circuit 312, 322 and an amplifier circuit 313, 323. The output of the amplifier circuit 313, 323 is sent to an analog to digital converter within the microprocessor 115. The microprocessor 115 determines from the output of the amplifier circuit 313, 323 the value of the current flowing through the recloser 200.

In the embodiment shown in FIG. 3A the low current transformer circuit 311 has a low current transformer 311a and a low current burden resistor 311b. Those skilled in the art recognize that by applying Ohms' law, the low current burden resistor 311b provides a path for the current to flow as well as a measurable voltage drop. The low current transformer 311a has a turn ratio of 4:1, while the high current transformer 321a has a turn ratio of 1:1. By having a turn ratio of 4:1, the low current section 310 is able to amplify and process lower current levels. The low current burden resistor 311b is connected across the secondary winding of the low current transformer 311a. For ease of explanation, the remaining functional components of the low current section 310 are described and those descriptions apply to the identical functional components of the high current section 320.

The voltage drop across the low current burden resistor 311b is processed by the rectifying circuit 312 connected to the low current burden resistor 311b. The rectifying circuit 312 is used to rectify the negative voltages into positive voltages. Once the negative AC voltages have been rectified, they are summed together with the original positive voltages. By rectifying the negative voltage, the analog to digital converter is configured and centered for positive voltages.

The output of the rectifying circuit 312 is connected to the input of the amplifier circuit 313. The amplifier circuit 313 attenuates or amplifies the output of the rectifier circuit 312 to meet the requirements of the particular analog to digital converter being used. For the Motorola HC12D60 microprocessor, the signal needs to be scaled in half to provide the best resolution and thus circuit 313 provides an attenuation factor of two (2) to the analog signal at its input.

Figure 3B:
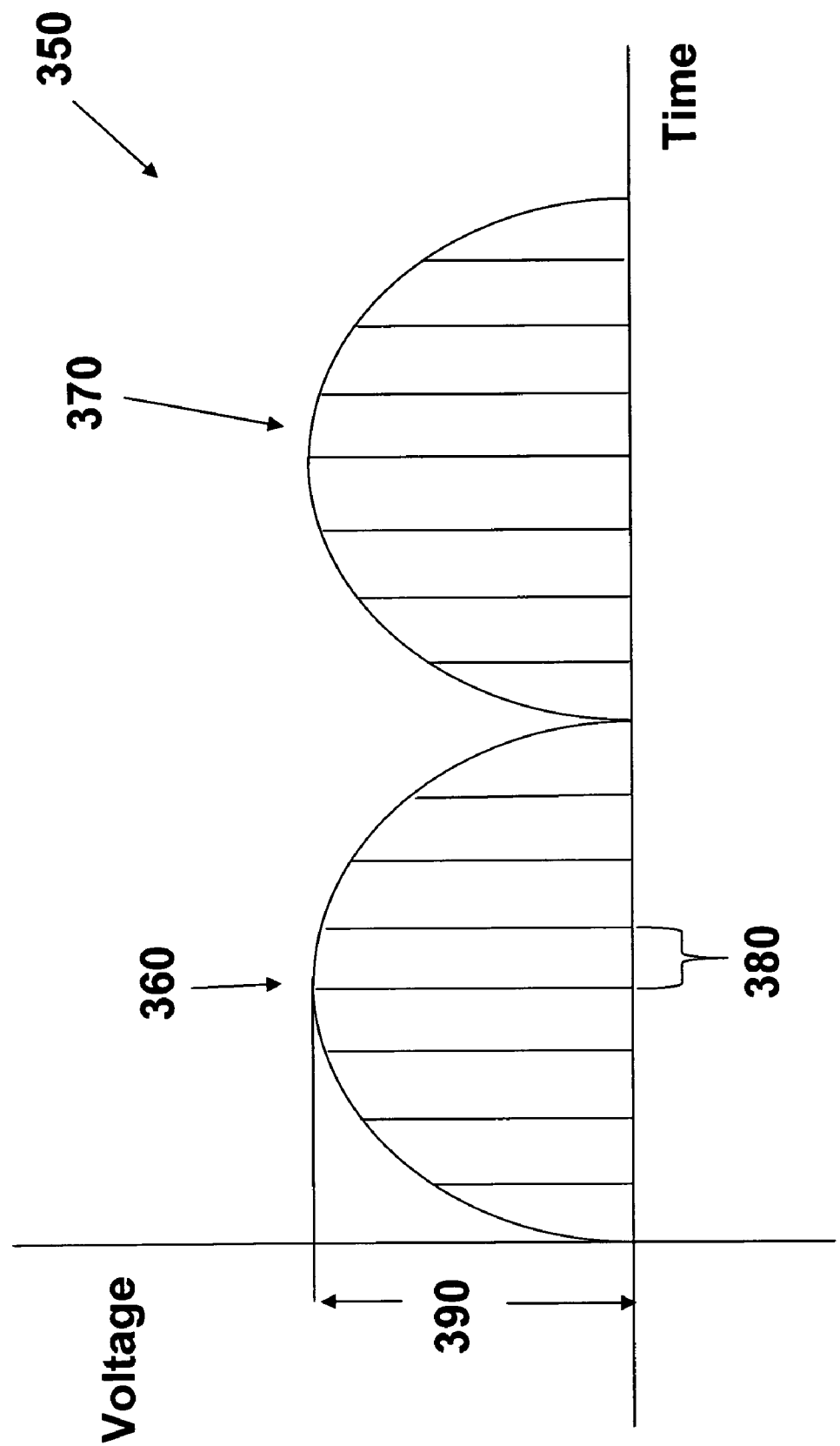
FIG. 3B shows a typical voltage waveform from a current amplifier circuit.

FIG. 3B shows a typical voltage waveform 350 from the current amplifier circuit 313. The voltage waveform 350 is plotted as voltage versus time. The original positive AC waveform is shown at 360 and the rectified AC waveform is shown at 370. The attenuation or amplification provided by the current amplifier circuit 313 affects the amplitude of the voltage waveform 390.

The output 314 of the low current amplifier circuit 313 is connected to an analog input pin of the microprocessor 115. The Motorola microprocessor has several built in analog to digital converters. The corresponding output 324 from the high current amplifier circuit 323 is sent to another analog input pin of the microprocessor 115. The microprocessor 115 computes a value of current flowing through the power switching device 110 based on the analog to digital conversion of the voltage across the low voltage burden resistor 311b. If the value of current is less than a preprogrammed switching threshold, the output of the low current circuit 310 is used by the microprocessor 115 for computational and displaying purposes. If the current exceeds the switching threshold, then the output from the high current circuit 320 is used by the microprocessor 115 for computational and displaying purposes.

Figure 4:
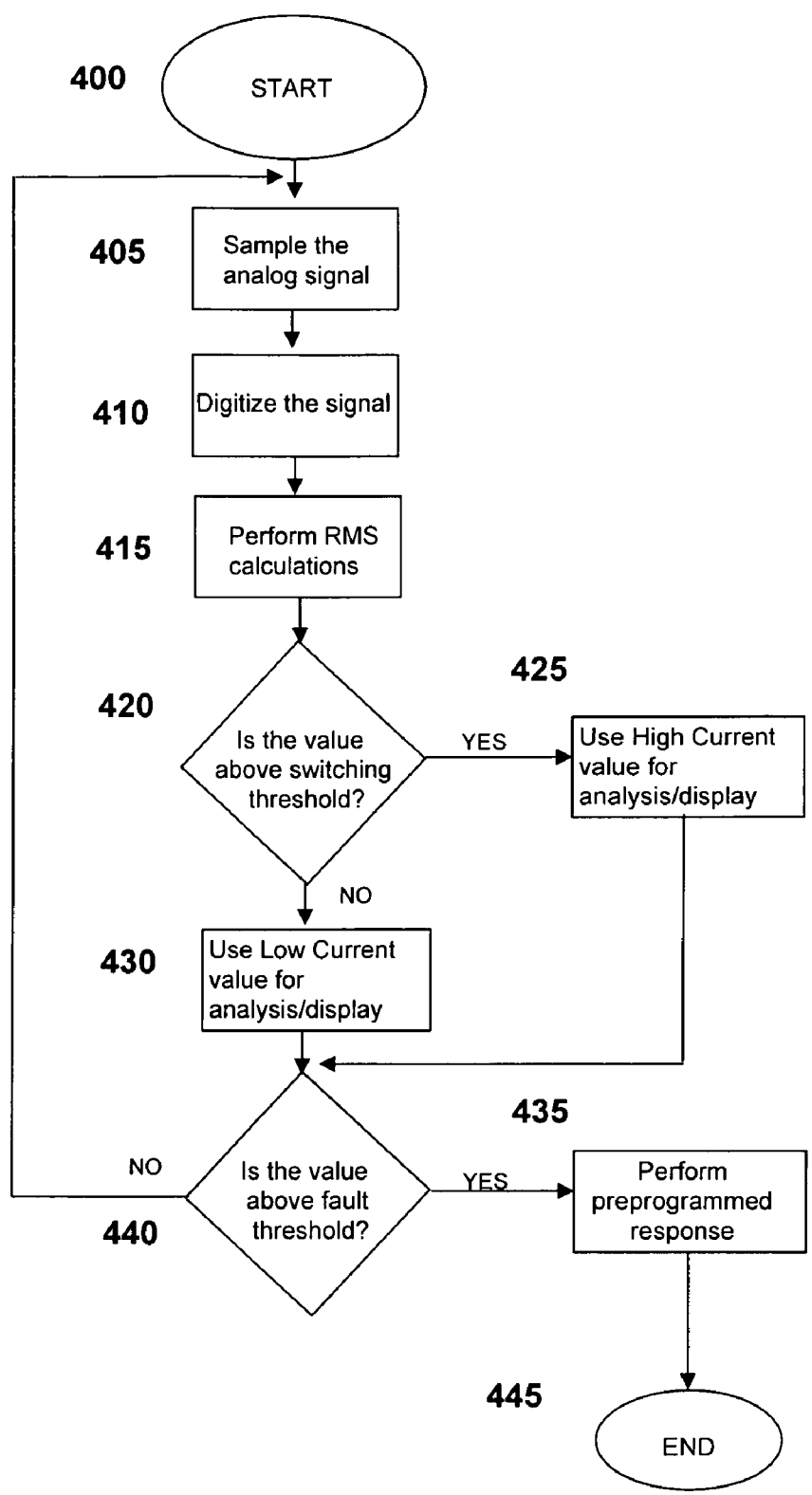
FIG. 4 is an illustrative flow chart showing the software process used by the controller software in implementing the present invention.

FIG. 4 illustrates a flow chart describing the steps performed by the microprocessor 115 in accordance with the present invention. The process flow begins at step 400. In step 405, the microprocessor samples the inputs from both the low current amplifier circuit 313 and the high current amplifier circuit 323. The sampling is illustrated in FIG. 3B. In this embodiment, the sampling rate is approximately every 512 μs, or about 32 samples 380 per 60 Hz. AC cycle. In step 410, the microprocessor 115 performs the analog to digital conversion for both inputs. The microprocessor 115 then performs an RMS (Root Mean Squared) calculation on the values in step 415. In decision step 420, the RMS values are compared to the switching threshold to determine which current value to use for further analysis. If the RMS value of the current exceeds the switching threshold, the high current value is used for subsequent analysis as shown in step 425. If the switching threshold has not been met, the low current value is used in step 430. The value of RMS current from the selected section 310 or 320 is also sent to the user interface 116 to be displayed to the user 118. In one example of the present invention, a value of approximately 600 amperes is used for the switching threshold.

In decision step 440, the microprocessor 115 determines if the fault threshold has been met. If the microprocessor 115 determines that the fault threshold has been met, the power switching device has experienced a fault. The microprocessor 115 then instructs the power switching device to execute its preprogrammed response in step 435. Otherwise, the microprocessor 115 returns to step 405 and continues to monitor the current through the power switching device 110.

It is to be understood that the foregoing description has been provided merely for the purpose of explanation and is in no way to be construed as limiting of the invention. Where the invention has been described with reference to embodiments, it is understood that the words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

We claim:

1. A controller for use in measuring current flowing through a power switching device, the controller comprising:

a first current sensing circuit, said first current sensing circuit receiving a proportional electrical current from the power switching device and producing a first output signal;

a second current sensing circuit, said second current sensing circuit receiving the proportional electrical current from the power switching device and producing a second output signal; and processing means for determining a value for the electrical current flowing through the power switching device, wherein said current value is determined based on said first output signal if said first output signal does not exceed a preprogrammed switching threshold or on said second output signal if said first output signal exceeds said preprogrammed switching threshold.

2. The controller of claim 1 wherein the power switching device is a recloser.

3. The controller of claim 1 wherein the processing means comprise a microprocessor.

4. A method for measuring electrical current flowing through a power switching device, the power switching device sending a proportional electrical current to a first current sensing circuit and to a second current sensing circuit, the method comprising:

processing the proportional electrical current and producing a first output signal through said first current sensing circuit and a second output signal through said second current sensing circuit; and determining a value for the electrical current flowing through the power switching device based on said first output signal if said first output signal does not exceed a preprogrammed switching threshold or on said second output signal if said first output signal exceeds said preprogrammed switching threshold.

5. The method of claim 4 wherein the processing of the proportional electrical current further comprises determining a potential value related to the electrical current and the potential value is converted from an analog value to a digital value.

6. The method of claim 4 wherein processing the proportional electrical current further comprises converting the current into a voltage signal.

7. The method of claim 6 wherein determining a value for the electrical current flowing through the power switching device further comprises converting said voltage signal.

8. The method of claim 4 wherein determining a value for the electrical current flowing through the power switching device is performed by a processing means.

9. The method of claim 4, further comprising comparing the value for the electrical current with a fault threshold.

10. The method of claim 9, further comprising instructing the power switching device to execute a preprogrammed response if the current value is above the fault threshold.

* * * * *